US007018866B2

(12) United States Patent
Sugaya et al.

(10) Patent No.: US 7,018,866 B2
(45) Date of Patent: Mar. 28, 2006

(54) CIRCUIT COMPONENT BUILT-IN MODULE WITH EMBEDDED SEMICONDUCTOR CHIP AND METHOD OF MANUFACTURING

(75) Inventors: Yasuhiro Sugaya, Toyonaka (JP); Toshiyuki Asahi, Osaka (JP); Shingo Komatsu, Kadoma (JP); Yoshiyuki Yamamoto, Neyagawa (JP); Seiichi Nakatani, Hirakata (JP); Satoru Yuhaku, Osaka (JP); Kazuo Ohtani, Habikino (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 45 days.

(21) Appl. No.: 10/753,933

(22) Filed: Jan. 7, 2004

(65) Prior Publication Data

US 2004/0145044 A1    Jul. 29, 2004

Related U.S. Application Data

(62) Division of application No. 10/346,917, filed on Jan. 17, 2003, now Pat. No. 6,784,530.

(30) Foreign Application Priority Data

Jan. 23, 2002    (JP) .............................. 2002-014670

(51) Int. Cl.
*H01L 21/44* (2006.01)
*H01L 21/48* (2006.01)
*H01L 21/50* (2006.01)

(52) U.S. Cl. ...................... 438/108; 438/109; 257/687; 257/698; 257/777; 257/778

(58) Field of Classification Search ................ 438/108, 438/109; 257/687, 698, 777, 778
See application file for complete search history.

(56) References Cited

U.S. PATENT DOCUMENTS 5,081,563 A    1/1992    Feng et al. .................. 361/414

(Continued)

FOREIGN PATENT DOCUMENTS

JP    63-47991    2/1988

(Continued)

OTHER PUBLICATIONS

"Stacking Semiconductor Packages" Dr. Denda, et al., International Conference on Electronics Packaging, pp. 16-21, (Apr. 18-20, Tokyo Ryutsu Center, Tokyo, Japan).

*Primary Examiner*—W. David Coleman
*Assistant Examiner*—Khiem Nguyen
(74) *Attorney, Agent, or Firm*—Hamre, Schumann, Mueller & Larson, P.C.

(57) ABSTRACT

A circuit component built-in module includes: a first electrical insulating substrate made of a mixture containing an inorganic filler and a thermosetting resin; a plurality of wiring patterns formed at least on a principal surface of the first electrical insulating substrate; a semiconductor chip incorporated in the first electrical insulating substrate and connected electrically with the wiring patterns; and inner vias electrically connecting the plurality of wiring patterns with one another, the inner vias passing through the first electrical insulating substrate. In the circuit component built-in module, the semiconductor chip has a thickness of not less than 30 μm and not more than 100 μm, and has a non-wired surface ground, and the circuit component built-in module has a thickness in a range of not less than 80 μm and not more than 200 μm. With this configuration, the high-performance and compact-size circuit component built-in module in which circuit components are mounted at a high density is provided so as to be used suitably in various types of electronic information devices.

15 Claims, 13 Drawing Sheets

U.S. PATENT DOCUMENTS

| | | | |
|---|---|---|---|
| 5,241,456 A | 8/1993 | Marcinkiewicz et al. | 361/792 |
| 5,336,928 A | 8/1994 | Neugebauer et al. | 257/758 |
| 5,346,750 A | 9/1994 | Hatakeyama et al. | 428/209 |
| 5,565,706 A | 10/1996 | Miura et al. | 257/723 |
| 5,724,232 A | 3/1998 | Bhatt et al. | 361/762 |
| 5,745,984 A | 5/1998 | Cole et al. | 29/834 |
| 5,777,381 A | 7/1998 | Nishida | 257/693 |
| 5,821,456 A * | 10/1998 | Wille et al. | 174/52.2 |
| 5,874,770 A | 2/1999 | Saia et al. | 257/536 |
| 5,877,550 A | 3/1999 | Suzuki | 257/700 |
| 6,038,133 A * | 3/2000 | Nakatani et al. | 361/760 |
| 6,154,366 A | 11/2000 | Ma et al. | 361/704 |
| 6,239,496 B1 | 5/2001 | Asada | 237/777 |
| 6,387,734 B1 | 5/2002 | Inaba et al. | 438/125 |
| 6,469,374 B1 * | 10/2002 | Imoto | 257/686 |
| 6,518,093 B1 | 2/2003 | Nakamikawa | 438/208 |
| 6,538,210 B1 | 3/2003 | Sugaya et al. | 174/258 |
| 6,559,531 B1 | 5/2003 | Sutherland | 257/686 |
| 6,576,984 B1 | 6/2003 | Takahashi et al. | 257/668 |
| 6,590,291 B1 | 7/2003 | Akagawa | 257/774 |
| 6,734,542 B1 * | 5/2004 | Nakatani et al. | 257/687 |
| 6,784,530 B1 * | 8/2004 | Sugaya et al. | 257/686 |
| 6,798,121 B1 * | 9/2004 | Nakatani et al. | 310/340 |
| 6,931,725 B1 * | 8/2005 | Sugaya et al. | 29/852 |
| 2002/0159242 A1 | 10/2002 | Nakatani et al. | 361/760 |
| 2002/0175402 A1 | 11/2002 | McCormack et al. | 257/700 |
| 2003/0057544 A1 | 3/2003 | Nathan et al. | 257/700 |
| 2003/0141105 A1 * | 7/2003 | Sugaya et al. | 174/256 |
| 2004/0088416 A1 * | 5/2004 | Nakatani et al. | 709/226 |
| 2004/0158980 A1 * | 8/2004 | Nakatani et al. | 29/852 |
| 2004/0160751 A1 * | 8/2004 | Inagaki et al. | 361/763 |
| 2005/0118750 A1 * | 6/2005 | Baba et al. | 438/128 |

FOREIGN PATENT DOCUMENTS

| | | |
|---|---|---|
| JP | 5-259372 | 10/1993 |
| JP | 6-268345 | 9/1994 |
| JP | 9-283698 | 10/1997 |
| JP | 11-103147 | 4/1999 |
| JP | 11-163249 | 6/1999 |
| JP | 11-220262 | 8/1999 |
| JP | 2000-183283 | 6/2000 |
| JP | 2001-68624 | 3/2001 |
| JP | 2001-244638 | 9/2001 |
| JP | 2001-332654 | 11/2001 |

* cited by examiner

CIRCUIT COMPONENT BUILT-IN MODULE WITH EMBEDDED SEMICONDUCTOR CHIP AND METHOD OF MANUFACTURING

"This application is a divisional of application Ser. No. 10/346,917, filed Jan. 17, 2003 U.S. Pat. No. 6,784,530, which application(s) are incorporated herein by reference."

BACKGROUND OF THE INVENTION

1. Field of the Invention

The present invention relates generally to a circuit component built-in module and a method for manufacturing the same. More specifically, it relates to a method for manufacturing a circuit component built-in module, in which semiconductor chips are incorporated in electrical insulating substrates for reducing the thickness and forming a stacked module, whereby the high-density mounting of components is achieved.

2. Related Background Art

Following the tendency of electronic information devices toward high performance and compact size so as to be fit for the information communication industry that has developed remarkably in recent years, it is increasingly demanded to achieve high density, improved function, and shortened wiring of circuit components used in such electronic information devices. To achieve such characteristics, it is demanded increasingly to reduce the thickness of a module incorporating a circuit component or an electronic element significantly, namely, a circuit component built-in module.

Since the technique of mounting a circuit component on a surface of a substrate only has a limited capability of reducing the thickness of a circuit component, another technique has been proposed in which a recess is provided in the substrate and a semiconductor chip is arranged therein so as to make the substrate thinner, whereby the high-density mounting of circuit components is attempted (JP 5(1993)-259372A, JP 11(1999)-103147 A, JP 11(1999)-163249 A). In this technique, after an active component such as a semiconductor chip is mounted on a recess of a substrate, a resin is applied to the recess so as to seal and protect connected portions where the semiconductor chip and the substrate are connected, as well as the semiconductor chip.

Furthermore, another technique has been proposed in which circuit substrates are stacked so as to achieve the high-density mounting. Since a conventional technique in which a through hole structure is formed by drilling a substrate that is formed by impregnating a glass fiber cloth with an epoxy resin (glass-epoxy substrate) has a limited capability for achieving the high densification, there arises a problem that connections of wiring patterns between large scale integrated circuits (LSI) and between components cannot be achieved with minimum distances. However, to solve this problem, the inner via hole connecting technique has been proposed (JP 63(1988)-47991 A, JP 6(1994)-268345 A). Such an inner via hole connecting technique allows only specific laminated layers to be connected with each other, thereby having excellent semiconductor chip mounting characteristics.

Furthermore, JP 11(1999)-220262 A has proposed, as an example of a circuit component built-in module, a module with high heat dissipating ability in which a semiconductor chip is built in a circuit substrate with high heat conductivity and a multiplicity of such circuit substrates are stacked.

As another known example, ICEP Proceeding Stacking Semiconductor Packages, 2001, pp. 16–21 has been proposed. The following describes this example while referring to FIGS. 12A and 12B. Glass-epoxy substrates 1002, on each of which a flexible semiconductor chip 1001 with a thickness of 50 μm to 100 μm is mounted (FIG. 12A), are stacked so as to form a stacked memory package 1003 (FIG. 12B) that achieves the high-density mounting. In FIG. 12A, 1004 denotes a projection electrode of the semiconductor chip 1001, 1005 denotes a surface electrode of a glass-epoxy substrate 1002, 1006 denotes a sealing resin, 1007 denotes a glass-epoxy substrate, 1008 denotes a via, 1009 denotes a wiring line, and 1010 denotes a recessed space.

However, when the technique of providing the recessed space 1010 in the circuit substrate and arranging the semiconductor chip 1001 therein is used, the process of forming a recess in the substrate is expensive, irrespective of which type is used, a ceramic substrate or a resin-based substrate, and a problem of a decrease in the manufacturing yield arises also. Furthermore, in the technique for arranging a semiconductor chip and applying a sealing resin to a glass-epoxy substrate, the via hole connecting technique by drilling and plating through holes is used. In this case, since the material used for forming a substrate normally is a resin such as glass-epoxy, the thermal conductivity of the substrate itself is low, thereby causing a module obtained to have a limited heat dissipating property, and impairing the reliability.

Furthermore, in a circuit component built-in module having multiple layers of circuit substrates, in a case where a multiplicity of circuit substrates are stacked in a vertical direction, the high-density mounting is limited, since the module as a whole has a relatively great thickness. In the case of a memory module in which memory semiconductor chips of different types are stacked in a vertical direction, such as a static random access memory (SRAM), a flash memory, etc., the thickness of the semiconductor chip is limited so that the module is formed thinner, while the layers in the whole module are limited to three or four in number, resulting in that the high-density mounting cannot be achieved sufficiently.

On the other hand, a technique of abrading a semiconductor chip on a wafer and thereafter dicing and mounting the same on a substrate has been developed actively, but such a thin semiconductor chip is difficult to handle, and the production efficiency thereof, which is determined by the mounting property of the same with respect to a substrate, is low.

Furthermore, in the stacked memory package 1003 in which thin semiconductor chips are stacked as shown in FIGS. 12A and 12B, the thickness of the substrate 1002 is predominant, and it is difficult to provide, for instance, a stack of about eight layers within a specific range of a module thickness. Furthermore, in such a stacked module, vias formed by plating are used generally as a means for connecting layers with each other, which requires a complex process for improving the adhesiveness between the layers. Besides, it makes it difficult to incorporate semiconductor chips in the substrates 1002, and produces gaps around the semiconductor chips, which possibly leads to, for instance, a danger of water vapor explosion in a reflowing process upon moisture absorption, thus impairing the reliability of a module obtained.

In such a thin stacked module, in the case where a glass-epoxy substrate, for instance, is used for increasing the strength of the substrate 1002, it is difficult to incorporate a semiconductor chip in the substrate 1002, and for instance, as shown in FIG. 13, it is necessary to mount chip components 1104 such as inductors (L), capacitors (C), resistors (R), etc. on the topmost surface of the module. Therefore, this restricts the structure design of the circuit board, such as the optimal arrangement of circuit components with a view to achieving the high-density mounting.

SUMMARY OF THE INVENTION

Therefore, with the foregoing in mind, it is an object of the present invention to provide a thin, high-performance, and compact-size circuit component built-in module in which circuit components are mounted at a high density so as to be used suitably in various types of electronic information devices, and a method for manufacturing the same.

To achieve the aforementioned objects, a circuit component built-in module of the present invention includes: a first electrical insulating substrate made of a mixture containing an inorganic filler and a thermosetting resin; a plurality of wiring patterns formed at least on a principal surface of the first electrical insulating substrate; a semiconductor chip incorporated in the first electrical insulating substrate and connected electrically with the wiring patterns; and inner vias electrically connecting the plurality of wiring patterns with one another, the inner vias passing through the first electrical insulating substrate. In the module, the semiconductor chip has a thickness of not less than 30 μm and not more than 100 μm, and has a non-wired surface ground, and the circuit component built-in module has a thickness in a range of not less than 80 μm and not more than 200 μm.

Next, a circuit component built-in module manufacturing method of the present invention is a method for manufacturing a circuit component-built in module that includes: a first electrical insulating substrate made of a mixture containing an inorganic filler and a thermosetting resin; a plurality of wiring patterns formed at least on a principal surface of the first electrical insulating substrate; a semiconductor chip incorporated in the first electrical insulating substrate and connected electrically with the wiring patterns; and inner vias formed to pass through the first electrical insulating substrate so as to electrically connect the plurality of wiring patterns with one another. The method includes: (a) preparing a plate-like member by forming through holes in the first electrical insulating substrate and filling the through holes with a thermosetting conductive material; (b) mounting a semiconductor chip on the wiring patterns, the wiring patterns being formed on a release carrier; (c) grinding a non-wiring surface of the semiconductor chip so as to reduce a thickness of the semiconductor chip to not less than 30 μm and not more than 100 μm; (d) aligning and laminating the plate-like member on a surface of the release carrier where the wiring patterns are formed so that the wiring patterns fall on the through holes filled with the conductive material, and applying pressure thereto so that the semiconductor chip is embedded in the plate-like member, thereby obtaining a semiconductor-chip-embedded product; (e) heating the semiconductor-chip-embedded product so that the mixture and the conductive material are cured simultaneously, to obtain the circuit component built-in module with a thickness of not less than 80 μm and not more than 200 μm; and (f) removing the release carrier.

DETAILED DESCRIPTION OF THE INVENTION

Figure 1:
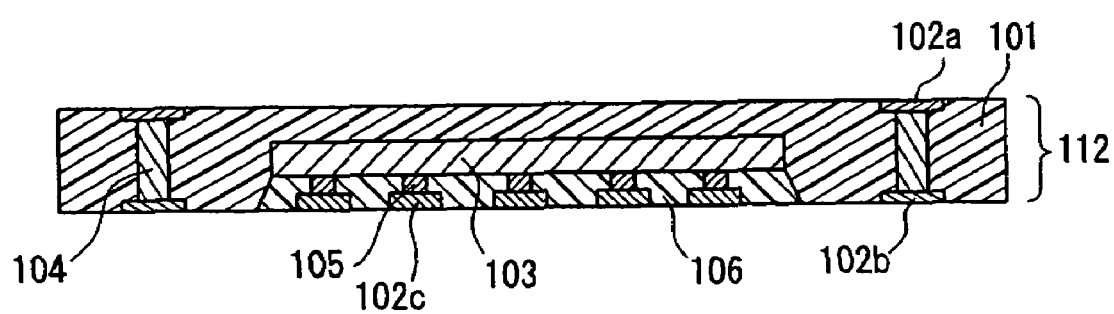
FIG. 1 is a cross-sectional view illustrating a circuit component built-in module according to Embodiment 1 of the present invention.

The foregoing circuit component built-in module is characterized in that a semiconductor chip is mounted on wiring patterns formed on the release carrier, the semiconductor chip is embedded in the electrical insulating substrate, and wiring patterns led from a surface of the semiconductor chip are connected electrically with the inner vias that are formed in the electrical insulating substrate so as to passing therethrough. This allows the circuit component built-in module to be formed with a reduced thickness, as well as allows a stacked module in which circuit components are provided at a high density to be obtained with high performance and a reduced size.

In the foregoing method of the present invention, after the semiconductor chip is mounted, the semiconductor chip is ground to have a thickness of not less than 30 μm to not more than 100 μm. The foregoing thickness is preferable for obtaining a thin and compact stacked module. Furthermore, the grinding of a non-wired surface of the semiconductor chip to reduce a thickness thereof to the foregoing range does not cause any problems in the performance.

Furthermore, in the case where the circuit component built-in module has a thickness of 80 μm to 200 μm, it is preferable for reducing the thickness and the size.

The semiconductor chip preferably is a wafer-level chip-scale package (wafer-level CSP) semiconductor, since it is preferable for securing the quality in addition to the thickness and size reduction.

In the foregoing (d), preferably, two of the release carriers on each of which the wiring patterns are formed and the semiconductor chips are mounted are utilized, and the plate-like member and the two release carriers are aligned, laminated, and subjected to pressure, with the plate-like member being interposed between the release carriers, so that the two semiconductor chips are embedded in the plate-like member in a state in which the semiconductor chips are arranged in a thickness direction and upper surfaces of the semiconductor chips face each other. This does not produce unnecessary spaces, therefore being preferable for the thickness and size reduction.

In the foregoing method, it is preferable that some of the wiring patterns are formed on the other principal surface of the first electrical insulating substrate; that two of the semiconductor chips are incorporated in the first electrical insulating substrate, in a state in which the semiconductor chips are arranged in a thickness direction of the first electrical insulating substrate and upper surfaces thereof face each other; and that one of the two semiconductor chips is connected electrically with the wiring patterns formed on one of the principal surface of the first electrical insulating substrate, and the other semiconductor chip is connected electrically with the wiring patterns formed on the other surface of the first electrical insulating substrate. This also does not produce unnecessary spaces, therefore being preferable for the thickness and size reduction.

The wiring patterns formed at least on the principal surface of the first electrical insulating substrate preferably constitute a part of wiring patterns on a top layer of a multilayer wiring substrate laminated on the first electrical insulating substrate. By using a multilayer wiring substrate, it is possible to achieve not only the high-density integration and the high performance but also a greater strength and an improved handleability.

The electrical insulating substrate preferably further incorporates a passive component, and the passive component is connected electrically with any one of the plurality of wiring patterns. The high performance is achieved by incorporating passive component at the same time. The passive component is, for instance, at least one selected from an inductor, a capacitor, and a resistor (hereinafter also referred to as LCR).

It is preferable that connected portions where the semiconductor chip and the wiring pattern are connected are reinforced by an underfill resin, a non-conductive film, or an anisotropic conductive film containing conductive particles. Here, the underfill material indicates a sealing resin, and it is made of, for instance, an inorganic filler and an epoxy resin. The underfill material is, when used, injected as a liquid resin composition.

A stacked module may be formed by (g) stacking four to eight of the circuit component built-in modules obtained through the foregoing (a) to (f). Here, adjacent ones of the circuit component built-in modules preferably are connected electrically with each other through the inner vias. This enables the circuit component built-in module to be formed in a stacked form with a desired number of layers.

It is preferable that second electrical insulating substrates are arranged between adjacent ones of the circuit component built-in modules, and the second electrical insulating substrates are made of the same composition as that of the first electrical insulating substrate. By forming the second electrical insulating substrate with the same composition as that of the first electrical insulating substrate, it is possible to make physical properties of the layers uniform.

In stacking four to eight of the circuit component built-in modules obtained through (a) to (f) so as to be in a multilayer module form, second electrical insulating substrates may be arranged between adjacent ones of the circuit component built-in modules, and film-form passive elements may be arranged on the second electrical insulating substrates.

The release carrier may be a metal sheet or a resin sheet.

Furthermore, the resin sheet preferably is a resin film made of at least one selected from polyimide, polyethylene terephthalate, polyethylene naphthalate, polyphenylene sulfite, polyethylene, polypropylene, and fluorine resins. The release carrier preferably has a thickness of 30 µm to 100 µm. The fluorine resin is, for instance, polytetrafluoroethylene (PTFE), tetrafluoroethylene-perfluoroalkyl vinyl ether copolymer (PFA), tetrafluoroethylene-hexafluoropropylene copolymer (FEP), polyvinyl fluoride, polyvinylidene fluoride, etc.

The metal sheet may be a copper foil. Alternatively, the release carrier may be made of a copper foil, the wiring patterns may be made of copper foils, and a detachment layer provided between the release carrier and the wiring patterns may be made of a chrome-plated layer.

Furthermore, in the case where a metal foil, for instance, a copper foil, with a thickness of not less than 30 µm is used as a release carrier, the copper foil wiring pattern may be formed with a metal-plated layer interposed therebetween, for instance, a Cr-plated layer or a Ni-plated layer. The wiring patterns can be formed by, for instance, photolithography or etching after causing a copper foil to adhere to the release carrier. This method allows the copper foil surface after removing the carrier sheet to be cleaner, as compared with the case where a resin film is used as a carrier. In other words, since the electrolytic plated interface is exposed directly, the non-treated copper foil interface, which is glossier since not being oxidized, can be exposed.

The semiconductor chip and the passive element preferably are subjected to the continuity test before being embedded in the plate-like member. This improves the yield of the product. It is of course preferable that the test is carried out after the circuit component built-in module is completed.

The following will describe embodiments of the present invention while referring to the drawings.

EMBODIMENT 1

FIG. 1 illustrates a cross section of a circuit component built-in module 112 according to the present embodiment. A circuit component built-in module 112 is configured so that a semiconductor chip 103 is incorporated in an electrical insulating substrate 101. 102b and 102c denote wiring patterns formed on a principal surface of an electrical insulating substrate 101, and 102a denotes a wiring pattern formed on another principal surface of the electrical insulating substrate 101. Each wiring pattern is made of a copper foil or a conductive resin composition. The wiring patterns 102a and 102b are connected electrically through inner vias 104 that pass through the electrical insulating substrate 101. A semiconductor chip 103 is connected electrically with a wiring pattern 102c via bumps 105. Connected portions where the semiconductor chip 103 and the wiring pattern 102c are connected with each other are sealed and reinforced with an electrical insulating sheet 106. The connected portions may be reinforced with use of a sealing resin such as an underfill material, a non-conductive film (NCF), or an anisotropic conductive film (ACF) containing conductive particles, instead of the foregoing electrical insulating sheet 106.

The thickness of the semiconductor chip 103 in the circuit component built-in module 112 has to be 30 µm to 100 µm, preferably 30 µm to 50 µm. If the thickness exceeds 100 µm, the reduction of thickness of the circuit component built-in module cannot be achieved, which sometimes makes it impossible to achieve sufficient high-density mounting of a stacked module. It should be noted that the thickness of the circuit component built-in module 112 is 80 µm to 200 µm.

In the present embodiment, not only the active components, namely, semiconductor chips such as transistors, integrated circuit (IC), and large scale integrated circuit (LSI), but also passive components such as various types of chip components having functions as inductors (L), capacitors (C), and resistors (R) of 1005 and 0603 sizes, surface acoustic wave (SAW) devices, capacitors formed by printing, and film-form elements having a function as a resistor may be connected with the wiring pattern 102c and incorporated in the circuit component built-in module 112.

The electrical insulating substrate 101 is made of a mixture containing an inorganic filler and a thermosetting resin. Examples applicable as the inorganic filler include $Al_2O_3$, MgO, BN, AlN, $SiO_2$, etc. Examples applicable as the thermosetting resin include epoxy resins, phenol resins, cyanate resins, and polyphenylene ether resins. The epoxy resins are preferred particularly because of the high heat resistance thereof.

A content of the inorganic filler with respect to the mixture preferably is 70 percent by weight (wt %) to 95 wt %. To increase the heat conductivity of the electrical insulating substrate, the inorganic filler preferably is filled at a high density. For instance, in the case where a $SiO_2$ (silica) filler is used for decreasing the dielectric constant of the substrate and the content of the same is set to be not less than 80 wt %, a heat conductivity of not less than 1 W/m·K is obtained. In the case where an AlN (aluminum nitride) filler is used for increasing the heat conductivity of the substrate as the inorganic filler and the content of the same is set to be 95 wt %, a heat conductivity of approximately 10 W/m·K is obtained. Furthermore, in the case where $Al_2O_3$ is used and the content of the same is set to be 88 wt %, a heat conductivity of approximately 3 W/m·K to 4 W/m·K is obtained.

The inorganic filler preferably has a mean particle diameter in a range of 0.1 µm to 100 µm. It should be noted that the mixture may contain a dispersant, a colorant, a coupling agent, a mold release agent, etc. as required, in addition to the inorganic filler.

The inner vias 104 may be made of a cured conductive resin composition. The conductive resin composition preferably is composed of a mixture containing 85 wt % to 92 wt % of metal particles and 8 wt % to 15 wt % of a thermosetting resin. Examples applicable as the metal particles include gold, silver, copper, nickel, and the like that have a high conductivity, and mixtures of the same. Copper is preferred particularly, since it causes minimum migration. Examples applicable as the thermosetting resin include epoxy resins, phenol resins, cyanate resins, and polyphenylene ether resins. Among these, epoxy resins are preferred because of the high heat resistance thereof.

The bumps 105 may be plated bumps or stud bumps, but with a view to improving the reliability of the connection thereof with the wiring pattern 102, stud bumps are used preferably.

In the foregoing configuration, a 30 µm- to 100 µm-thick semiconductor chip is incorporated in the electrical insulating substrate, and the wiring patterns of the module are connected with each other through the inner vias that are formed by filling through holes in the substrate. Therefore, it is possible to make the circuit component built-in module sufficiently thin. Furthermore, since the semiconductor chip is incorporated inside the electrical insulating substrate and sealed from the ambient atmosphere, it is possible to prevent the deterioration of the semiconductor chip due to moisture, thereby improving the reliability of the circuit component built-in module. This also facilitates the re-wiring and the quality check, and eases constraints on the structure design of the circuit board, thereby allowing for the manufacture of land grid array (LGA) electrodes in various configurations.

The following will describe an example of a method for manufacturing the circuit component built-in module 112 according to the present embodiment, while referring to FIGS. 2A to 2E.

Figure 2A:
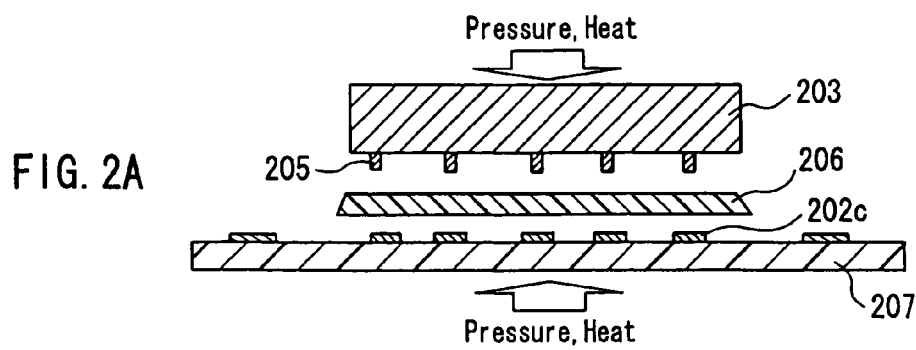
FIGS. 2A to 2F are cross-sectional views illustrating a process for manufacturing the circuit component built-in module according to Embodiment 1 of the present invention.

First of all, as shown in FIG. 2A, a semiconductor chip 203, 200 µm to 400 µm in thickness, is flip-chip-mounted on a wiring pattern 202c via bumps 205, using a release carrier 207 on which the wiring pattern 202c is formed. As the release carrier 207, any one of polyester films and organic resin films made of for instance, polyethylene terephthalate, polyphenylene sulfide, fluorine resins, etc. may be used, or alternatively, a metal foil made of any one of various metals, such as a copper foil or an aluminum foil, may be used. Furthermore, a release layer may be formed on the release carrier 207, by coating the same with an appropriate organic film.

The wiring pattern 202c may be formed by subjecting a surface of the release carrier 207 to electrolytic plating with the use of copper so that copper is deposited thereon to a thickness of approximately 9 µm to 35 µm. Alternatively, it may be formed by causing a copper foil to adhere to a surface of the release carrier 207 and thereafter subjecting the same to photolithography and etching. The wiring pattern 202c preferably is roughened for improving the adhesiveness thereof to a composite sheet 201, by depositing fine metal particles on a surface thereof or the like. The wiring pattern 202c may be a non-treated Cu foil without a rust inhibitor layer thereon, or surfaces thereof may be subjected to coupling treatment, so as to improve the adhesiveness and the oxidization resistance. Furthermore, the wiring pattern 202c may be formed by electrolytic plating with tin, zinc, nickel, gold, or the like, instead of copper, and furthermore, surfaces thereof may be subjected to solder plating with the use of a tin-lead alloy or lead-free solder plating with use of tin-silver-bismuth, etc.

Figure 2B:
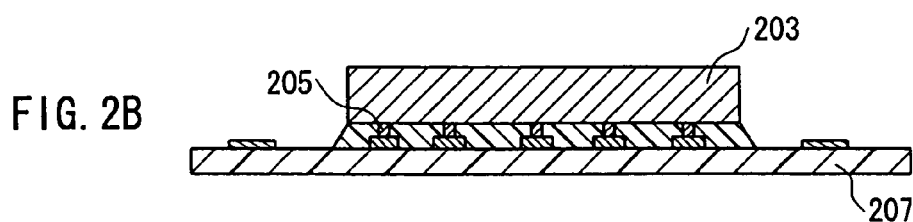

In the present embodiment, upon the flip-chip-mounting, the electrical insulating sheet 206 is interposed between the semiconductor chip 203 and the wiring pattern 202c, so as to reinforce the connected portions between the semiconductor chip 203 and the wiring pattern 202c. Then, heat and pressure are applied thereto, so that the connection between the semiconductor chip 203 and the wiring pattern 202c via bumps 205 is completed, as shown in FIG. 2B. A conductive adhesive may be used in place of the bumps 205. Applicable as the conductive adhesive is a thermosetting resin kneaded with gold, silver, copper, a silver-palladium alloy, or the like. Alternatively, instead of the use of the conductive adhesive, the connection may be achieved by forming gold bumps produced by gold wire bonding or solder bumps on the semiconductor chip 203 and melting the same by a heat treatment. The conductive adhesive and the solder bumps may be used in combination.

Instead of the use of the electrical insulating sheet 206, a sealing resin such as an underfill material may be injected to between the wiring pattern 202c and the semiconductor chip 203. By reinforcing the connected portions with a sealing resin, a stress occurring due to a difference between a thermal expansion coefficient of the semiconductor chip 203 and that of the composite sheet 201 is absorbed by a whole sealing resin, and the concentration of the stress is suppressed effectively. Therefore, when the semiconductor chip 203 is embedded in the composite sheet 201, it is possible to prevent the semiconductor chip 203 and the wiring pattern 202c from having gaps therebetween. Apart from a sealing resin, it is possible to use a non-conductive film (NCF) or an anisotropic conductive film (ACF) containing conductive particles as required.

Figure 2C:
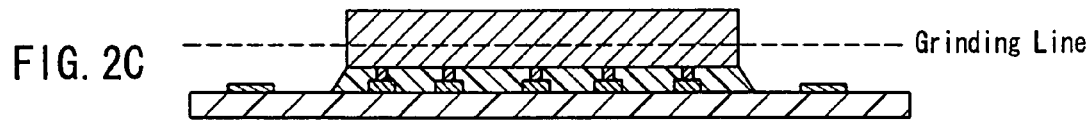

Next, as shown in FIG. 2C, the semiconductor chip 203 is ground by, for instance, a grinder having a surface layer composed of diamond abrasive grains or the like to a grinding line shown in the drawing, so as to have a thickness of 30 µm to 100 µm, preferably 30 µm to 50 µm. The reduction of the thickness is achieved by grinding herein, but it may be achieved by abrading such as lapping, or electrical discharge machining. However, in the case where it is processed at high speed, it is preferable that a release carrier is fixed on a die jig or the like and is processed by grinding. This method enables a semiconductor chip to be processed easily so as to reduce the thickness thereof from approximately 200 µm to 400 µm to approximately 50 µm to 100 µm at high speed without damaging the same.

Figure 2D:
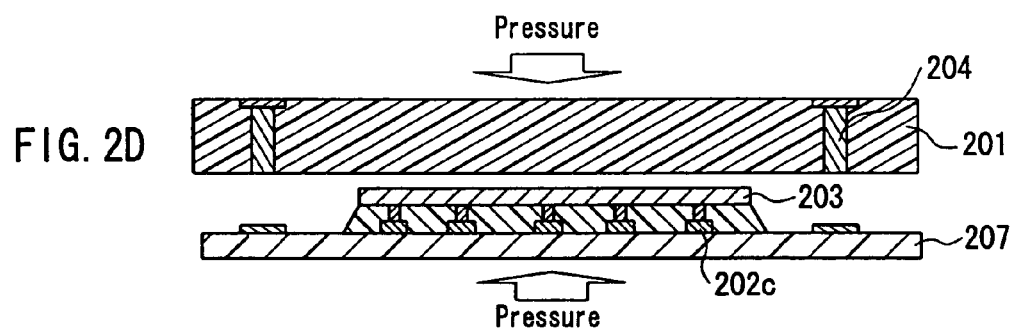

Subsequently, as shown in FIG. 2D, the release carrier 207 on which the semiconductor chip 203 is mounted and the composite sheet 201 having through holes 204 are aligned and laminated carefully so as not to displace and deform the through holes 204. The composite sheet 201 is produced by mixing an inorganic filler and a not cured thermosetting resin so as to form a mixture in a paste form, and forming the mixture into a plate form with a uniform thickness. Furthermore, a conductive resin composition containing metal particles and a not cured thermosetting resin is filled in the through holes 204.

Figure 2E:
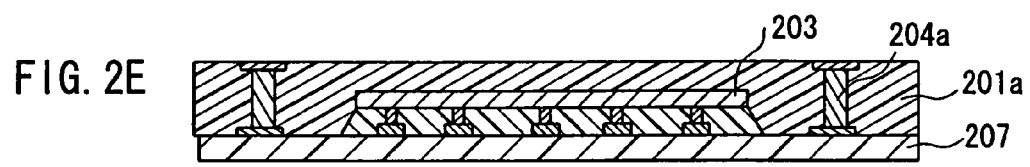

Next, pressure is applied so as to embed the semiconductor chip 203 into the composite sheet 201 as shown in FIG. 2E, and thereafter, it is heated at a temperature not lower than a temperature at which the mixture of the composite sheet 201 and the conductive resin in the through holes 204 are cured (for instance, 150° C. to 260° C.). Through this process, the composite sheet 201 becomes an electrical insulating substrate 201a and the through holes 204 become inner vias 204a. Besides, in this process, wiring patterns 202a and 202b adhere to the electrical insulating substrate 201a firmly. It should be noted that the transfer of wiring patterns and the reliability of via connections of a circuit component built-in module 212 obtained can be improved by applying a pressure of 10 kg/cm² to 200 kg/cm² during the heat application.

Figure 2F:
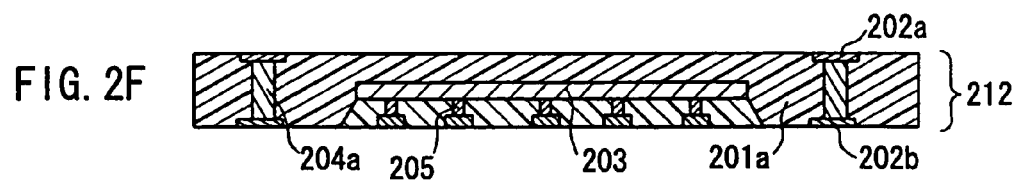

Thereafter, as shown in FIG. 2F, the release carrier 207 is removed mechanically from the electrical insulating substrate 201a, thereby transferring the wiring patterns 202b and 202c onto the electrical insulating substrate 201a. Thus, a circuit component built-in module 212 is obtained.

It should be noted that thereafter the wiring patterns 202a and 202b may be fixed to the circuit component built-in module 212 by printing a resist on a principal surface of the circuit component built-in module 212 and the other principal surface thereof opposite to the foregoing, or alternatively, the wiring patterns 202a and 202b may be sealed by injecting an underfill to the wiring pattern area or by laminating a not cured resin sheet onto the circuit component built-in module 212.

In this manufacturing method, the semiconductor chip mounted on the release carrier is processed so as to be thinner. Therefore, this allows a thin circuit component built-in module with a thickness of 80 µm to 200 µm to be manufactured stably.

Furthermore, since a mixture of an inorganic filler and a thermosetting resin is used for forming an electrical insulating substrate, a baking process at a high temperature that is indispensable for a ceramic substrate is unnecessary, thereby facilitating the production of the substrate.

Furthermore, since an inorganic filler is contained in the electrical insulating substrate, the heat generated at the semiconductor chip is dissipated to the outside smoothly, which improves the reliability of the circuit component built-in module. Moreover, by varying the type of the inorganic filler and the content of the same in the substrate to vary the linear expansion coefficient, the heat conductivity, and the dielectric constant of the substrate, circuit component built-in modules with various characteristics are manufactured easily. For instance, by setting the linear expansion coefficient of the substrate so as to be close to that of the semiconductor chip, cracks due to temperature changes can be prevented effectively. Besides, by setting the dielectric constant of the substrate at a lower level, a module for a high-frequency circuit having a small dielectric loss can be manufactured.

Furthermore, a bare semiconductor chip generally is difficult to handle and thereby incurs constraints as to the cost since it has to be subjected to a quality check before being mounted on a substrate. However, in this manufacturing method, with the state in which a semiconductor chip is incorporated in a substrate being regarded as an initial package form, the quality of a semiconductor chip is checked. Therefore, the problems of the so-called KGD (known good die) can be solved. Here, the production of KGD indicates that burn-in is performed including the continuity test in a heated state, and accepted products are treated as package products.

EMBODIMENT 2

Figure 3A:
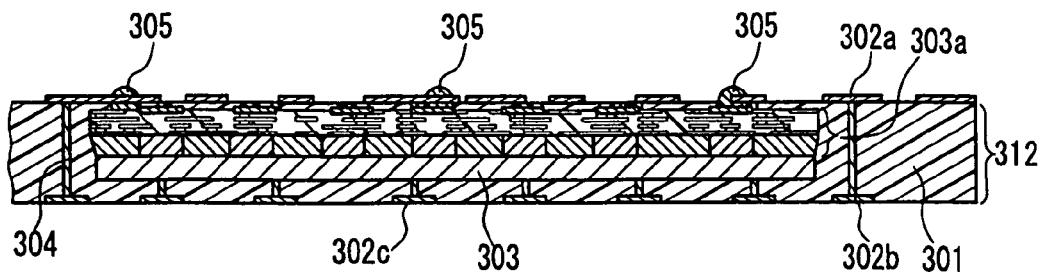
FIGS. 3A to 3D are cross-sectional views illustrating a circuit component built-in module according to Embodiment 2 of the present invention.

FIG. 3A illustrates a cross section of a circuit component built-in module 312 according to the present embodiment. The circuit component built-in module 312 is configured so that a semiconductor chip 303 in a wafer-level chip-scale package (wafer-level CSP) form having a sufficiently small chip thickness is incorporated in an electrical insulating substrate 301. A multilayer substrate 303a is integrated and incorporated additionally. 302a denotes a wiring pattern formed on a principal surface of the electrical insulating substrate 301, and 302b denotes a wiring pattern formed on the other principal surface of the electrical insulating substrate 301. Wiring patterns 302a and 302b are connected electrically with each other through inner vias 304 that pass through the electrical insulating substrate 301.

Figure 3B:
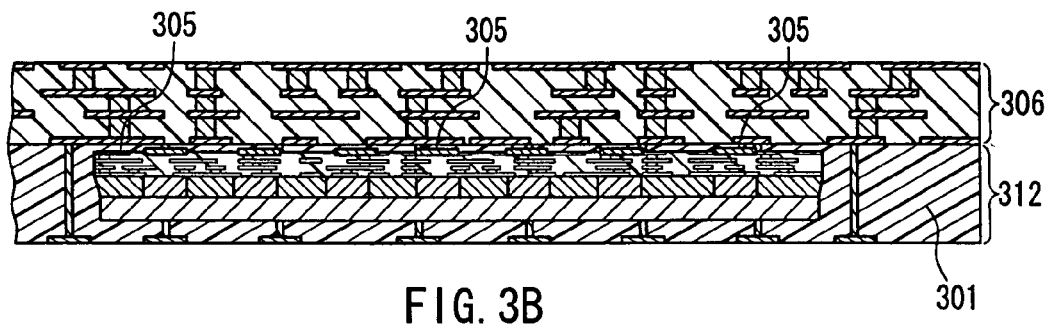

FIG. 3B illustrates an example of a configuration in which a wafer-level CSP 303a is mounted on a multilayer substrate 306 for rewiring. A circuit component built-in module 312 is connected with a multilayer substrate 306 via metal bumps 305.

It is required that the semiconductor chip 303 has a thickness of 30 µm to 100 µm, preferably 30 µm to 50 µm. If the thickness exceeds 100 µm, the thickness of the circuit component built-in module 312 cannot be reduced, thereby causing an inconvenience in implementing the high-density mounting. Furthermore, the circuit component built-in module 312 has a thickness of 300 µm to 600 µm.

According to the configuration shown in FIG. 3A, in the case where a wafer-level CSP 303a with fewer pins in number is used, the wafer-level CSP 303a is flip-chip-mounted, while a wiring pattern including one for rewiring is formed simultaneously. Therefore, a multilayer substrate for rewiring is unnecessary, which enables the more effective thinning of a module. On the other hand, as shown in FIG. 3B, in the case where the multilayer substrate 306 for rewiring is needed, an effect achieved by thinning the circuit component built-in module 312 influences more significantly, making a greater contribution to the high-density mounting.

Furthermore, according to the configuration, the semiconductor chip 303 in the CSP state, that is, in a state in which the quality thereof is guaranteed, is incorporated in the circuit component built-in module 312. Therefore, the problems associated with KGD are solved fundamentally.

Figure 3C:
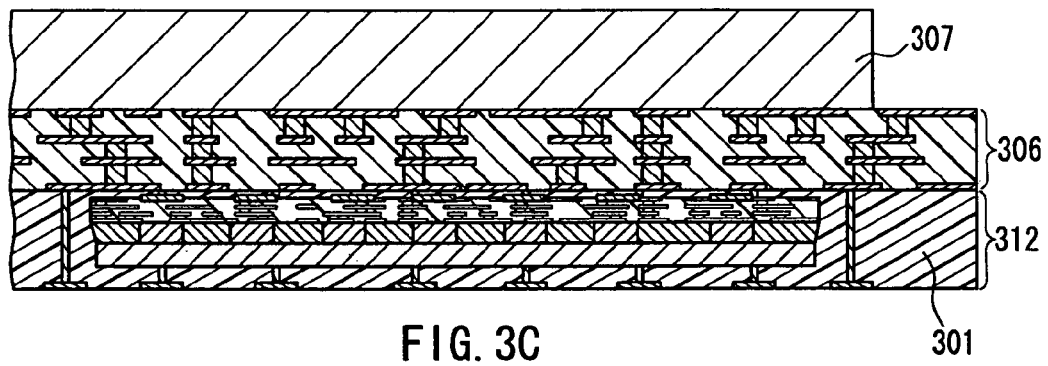
Figure 3D:
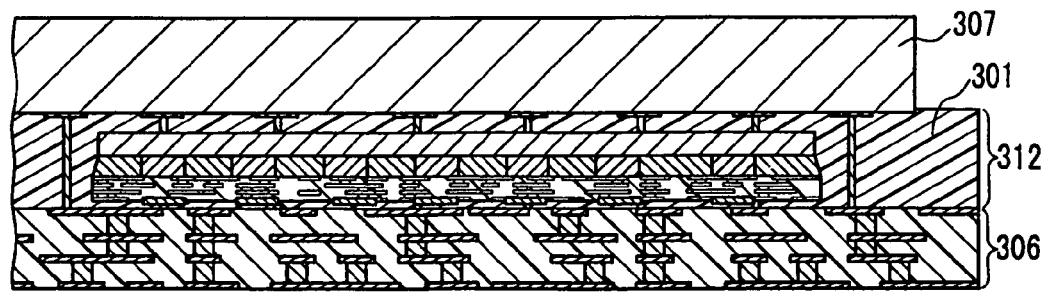

FIGS. 3C and 3D illustrate examples in each of which another semiconductor package 307 is mounted and stacked on the multilayer substrate 306 or the electrical insulating substrate 301. In the case where a wiring pattern thus formed on at least a principal surface of the electrical insulating substrate 301 is configured to match a wiring pattern in a first layer of the multilayer substrate 306, this makes the circuit component built-in module 312 applicable in a wider range. For instance, in the case where a semiconductor chip 303 having a CPU function is processed thinner and is incorporated in an electrical insulating substrate, and thereafter a semiconductor package 307 having a memory function (memory package) is mounted and stacked thereon, a thin and space-saving functional block is configured.

Figure 4A:
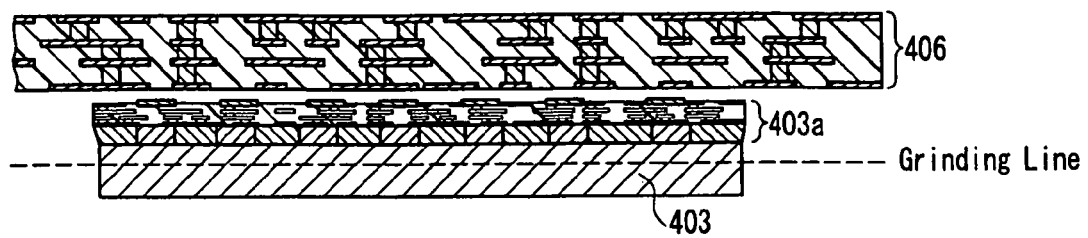
FIGS. 4A to 4C are cross-sectional views illustrating a process for manufacturing the circuit component built-in module according to Embodiment 2 of the present invention.
Figure 4B:
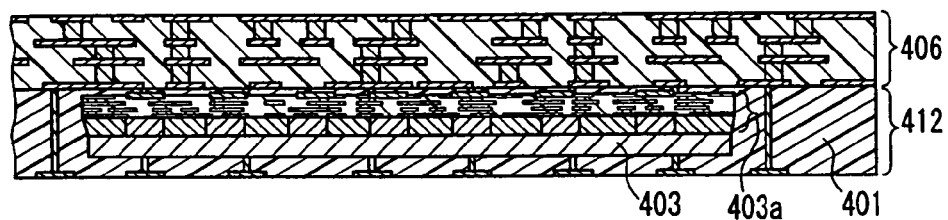
Figure 4C:
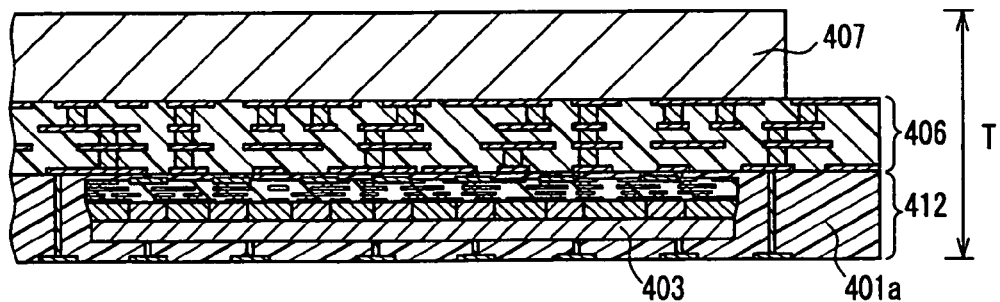

The following describes an example of a method for manufacturing the circuit component built-in module 312 according to the present embodiment, while referring to FIGS. 4A to 4C.

First of all, as shown in FIG. 4A, a wafer-level CSP 403a is flip-chip-mounted on a multilayer substrate 406 by reflowing, and a semiconductor chip 403 is ground by a grinder or the like to a grinding line shown in the drawing, so as to have a thickness of 30 µm to 100 µm, preferably 30 µm to 50 µm. The reduction of the thickness is achieved by grinding herein, but it may be achieved by abrading such as lapping, or electrical discharge machining. However, in the case where it is processed at high speed, it is preferable that the multilayer substrate 306 is fixed on a die jig or the like and is processed by grinding. This method enables to process a thick semiconductor chip easily so as to reduce the thickness thereof from approximately 200 µm to 400 µm to approximately 50 µm to 100 µm at high speed without damaging the same.

Subsequently, as shown in FIG. 4B, the multilayer substrate 406 on which a waver level CSP 403a is mounted and a composite sheet 401 are laminated, and a pressure is applied thereto so that the wafer-level CSP 403a is embedded in the composite sheet 401. Then, it is heated at a temperature not lower than a temperature at which the mixture of the composite sheet 401 is cured (for instance, 150° C. to 260° C.). Through this process, the composite sheet 401 becomes an electrical insulating substrate 401a (FIG. 4C). 412 denotes a circuit component built-in module.

Thereafter, for instance as shown in FIG. 4C, a memory package 407 may be mounted and stacked on the multilayer substrate 406. This manufacturing method allows the circuit component built-in module 412 to be manufactured stably, which is so thin as to provide a total thickness T of 1 mm to 2 mm even in the case where the memory packages 407 are stacked. Furthermore, since a multilayer substrate on which a wafer-level CSP is mounted by reflowing is used, it is possible to enhance the production efficiency.

EMBODIMENT 3

Figure 5:
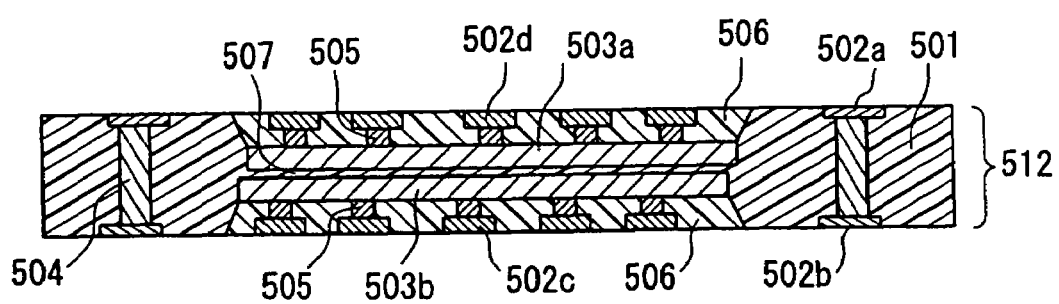
FIG. 5 is a cross-sectional view illustrating a circuit component built-in module according to Embodiment 3 of the present invention.

FIG. 5 illustrates a cross section of a circuit component built-in module 512 according to the present embodiment. Members thereof corresponding to the circuit component built-in module 112 according to Embodiment 1 are made of the same materials processed in the same manners. The circuit component built-in module 512 is configured so that semiconductor chips 503a and 503b are incorporated in an electrical insulating substrate 501 in a state in which upper surfaces of the semiconductor chips 503a and 503b face each other. 502b and 502c denote wiring patterns formed on a principal surface of the electrical insulating substrate 301, and 502a and 502d denote wiring patterns formed on the other principal surface of the electrical insulating substrate 501. The wiring patterns 502a and 502b are connected electrically with each other through inner vias 504 that pass through the electrical insulating substrate 501. The semiconductor chips 503a and 503b are connected electrically with the wiring patterns 502d and 502c, respectively, via bumps 505. A buffer layer 507 made of an inorganic filler and a thermosetting resin and having a thickness of 50 µm to 100 µm is formed between the semiconductor chip 503a and 503b. 506 denotes a layer of an electrical insulating sheet.

This configuration allows for the higher-density mounting of semiconductor chips in a circuit component built-in module. This effect is more significant in the case where circuit component built-in modules are stacked so as to form a stacked module.

The following describes an example of a method for manufacturing a circuit component built-in module 512 according to the present embodiment, while referring FIGS. 6A to 6E.

Figure 6A:
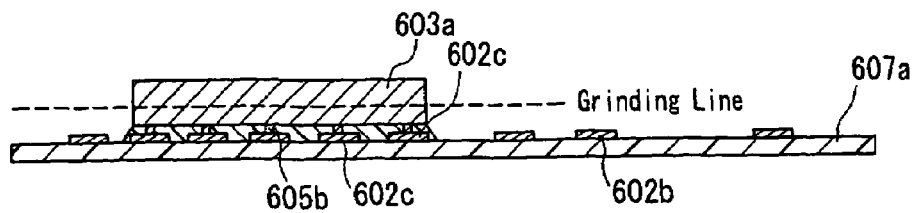
FIGS. 6A to 6E are cross-sectional views illustrating a process for manufacturing the circuit component built-in module according to Embodiment 3 of the present invention.

First of all, as shown in FIG. 6A, using a release carrier 607a having the wiring patterns 602b and 602c on which an Ni and Au layer are formed beforehand by electrolytic plating, a semiconductor chip 603a having a thickness of 200 µm to 400 µm is flip-chip-mounted on the wiring pattern 602c via bumps 605b. Then, the semiconductor chip 603a is ground by a grinder or the like to a grinding line shown in the drawing, so as to have a thickness of 30 µm to 100 µm, preferably 30 µm to 50 µm.

Figure 6B:
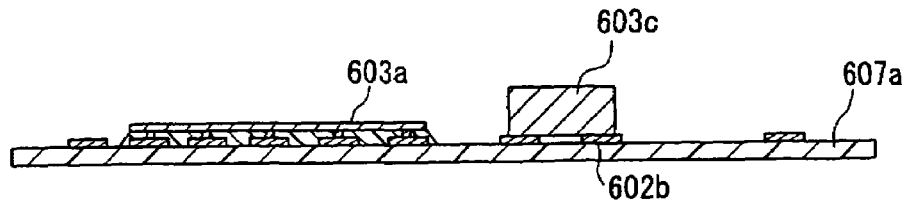

Next, as shown in FIG. 6B, a 0603-size chip capacitor 603c is mounted on the wiring pattern 602b on the release carrier 607a. In the case where connected portions in which the semiconductor chip 603a and the wiring pattern 602c are connected are reinforced with use of a sealing resin such as an underfill material, if the semiconductor chip 603a is flip-chip-mounted so that a distance from the chip capacitor 603c thereto is not more than 0.5 mm, a sealing resin protrudes approximately 0.5 mm, providing hindrance. Therefore, a non-conductive film (NCF) in a size substantially equal to an area occupied by the semiconductor chip 603a is used preferably in place of a sealing resin.

Figure 6C:
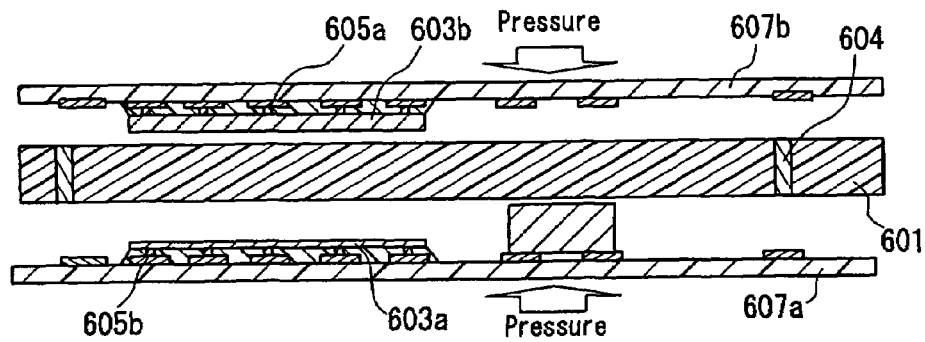

Subsequently, as shown in FIG. 6C, a composite sheet 601 having through holes 604, the release carrier 607a having the semiconductor chip 603a and the chip capacitor 603c mounted thereon, and a release carrier 607b having a semiconductor chip 603b mounted thereon are aligned and laminated on one another carefully so as not to displace and deform the through holes 604. 605a denotes a bump on the release carrier.

Figure 6D:
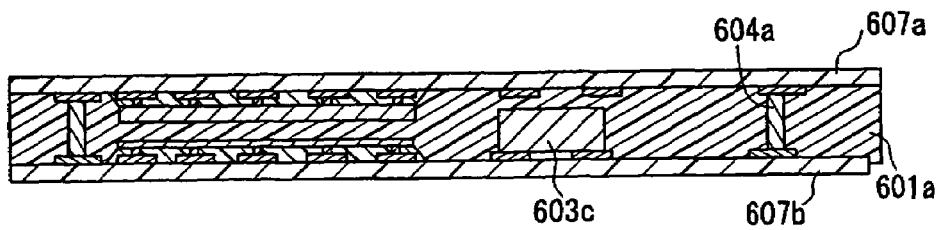

Next, a pressure is applied so as to embed the semiconductor chips 603a and 603b into the composite sheet 601 as shown in FIG. 6D, and thereafter, it is heated at a temperature not lower than a temperature at which the mixture of the composite sheet 601 and a conductive resin in the through holes 604 are cured (for instance, 150° C. to 260° C.). Through this process, the composite sheet 601 becomes an electrical insulating substrate 601a and the through holes 604, filled with the conductive resin, become inner vias 604a.

Figure 6E:
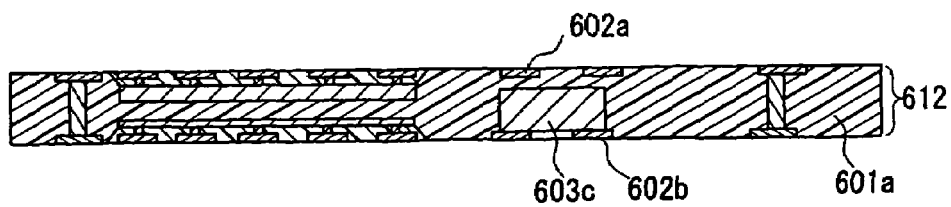

Thereafter, as shown in FIG. 6E, the release carrier 607a and 607b are removed mechanically from the electrical insulating substrate 601a, thereby transferring the wiring patterns 602a and 602b onto the electrical insulating substrate 601a. Thus, a circuit component built-in module 612 is obtained. Herein, since two semiconductor chips are incorporated, arranged in a thickness direction of the electrical insulating substrate 601a, thereby relatively thickening the semiconductor module as a unit, the removal of the release carrier is facilitated.

According to this manufacturing method, a second plate-form member (electrical insulating substrate 601a) contains an inorganic filler and a thermosetting resin component. Therefore, it is possible to manufacture a module incorporating a semiconductor chip and a passive element, without damaging the semiconductor chip and the passive element. Therefore, it is possible to incorporate, for instance, a bulky passive element such as a 0603-size capacitor chip or a film-form passive element, in the module. This manufacturing method eases constraints on the structure design of the circuit board, including those concerning the optimal arrangement of circuit components: for instance, it allows a semiconductor chip and a passive element to be arranged close to each other.

EMBODIMENT 4

Figure 7A:
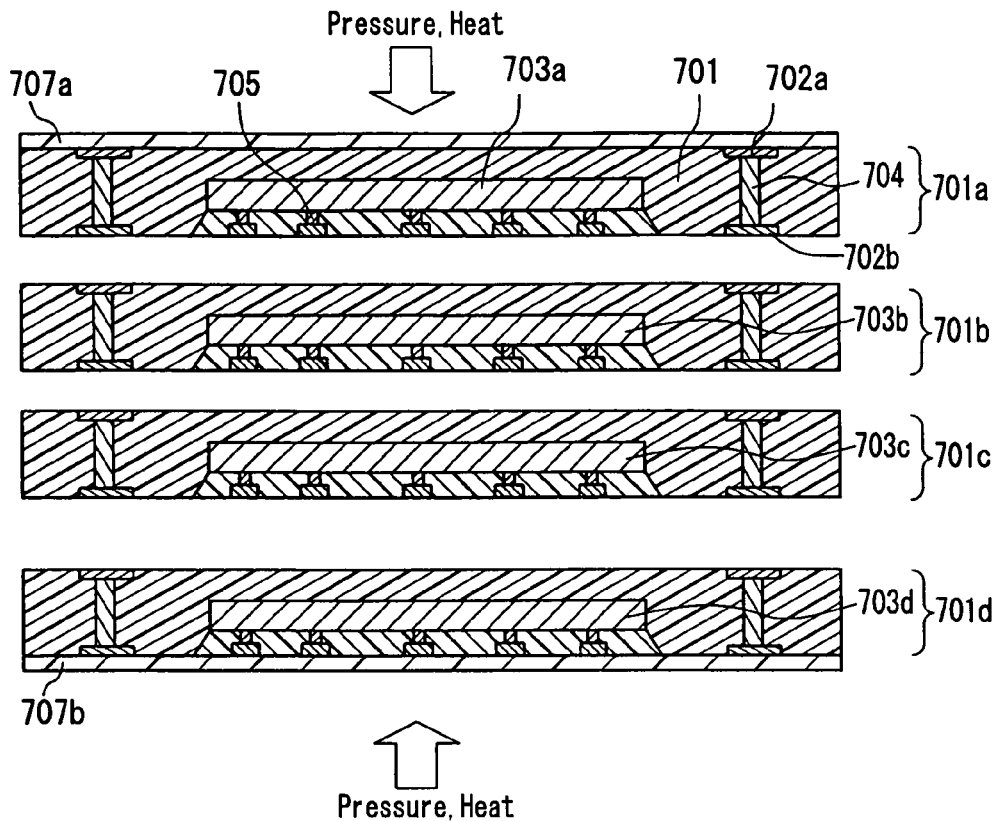
FIGS. 7A and 7B are cross-sectional views illustrating a process for manufacturing a stacked module according to Embodiment 4 of the present invention.
Figure 7B:
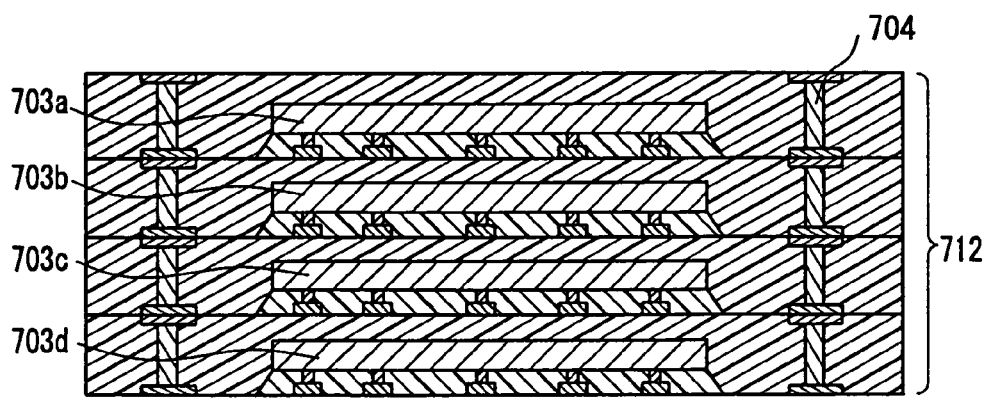

FIG. 7B illustrates a cross section of a stacked module 712 according to the present embodiment. The stacked module 712 is configured so that circuit component built-in modules 112, each of which is according to Embodiment 1, are stacked.

The following describes an example of a method for manufacturing the stacked module 712 according to the present embodiment, while referring to FIGS. 7A and 7B.

First of all, circuit component built-in modules 701a to 701d are produced (FIG. 7A) in the same manner as that in Embodiment 1 except for that the heating temperature is set to be in a range of 100° C. to 130° C. so that a mixture of a composite sheet 701 and a conductive resin composition in through holes 704 is maintained in a semi-cured or partially cured state (B-stage state).

Next, the circuit component built-in modules are stacked under a controlled pressure, so as to form a four-layer stacked module 712 (FIG. 7B). In FIGS. 7A and 7B, 702a and 702b denote wires formed on both surfaces of the inner vias 704, 703a to 703d denote semiconductor chips, 705 denotes a bump formed on a surface of the semiconductor chips, and 707a and 707b denote release carriers.

It should be noted that the stacked module 712 may be formed by stacking the circuit component built-in modules successively, or by stacking the same at once. In the case where they are stacked at once, the manufacturing process can be simplified, since a step of transferring wiring patterns and the like are unnecessary.

According to the present embodiment, for instance, in the case of a four-layer configuration, a thin stacked module with a thickness of 400 μm to 600 μm is obtained.

EMBODIMENT 5

Figure 9A:
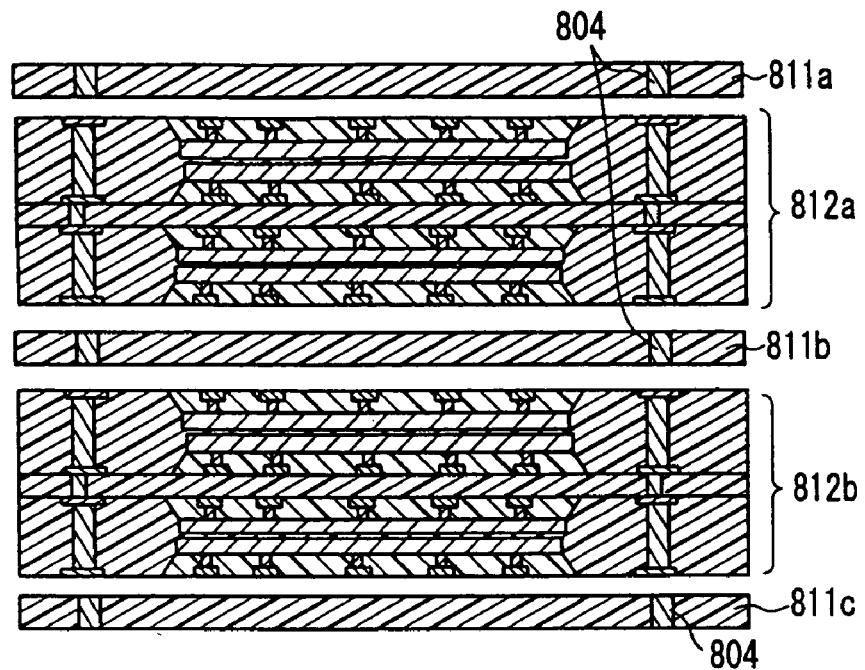
FIGS. 9A and 9B are cross-sectional views illustrating a process for manufacturing the stacked module according to Embodiment 5 of the present invention.
Figure 9B:
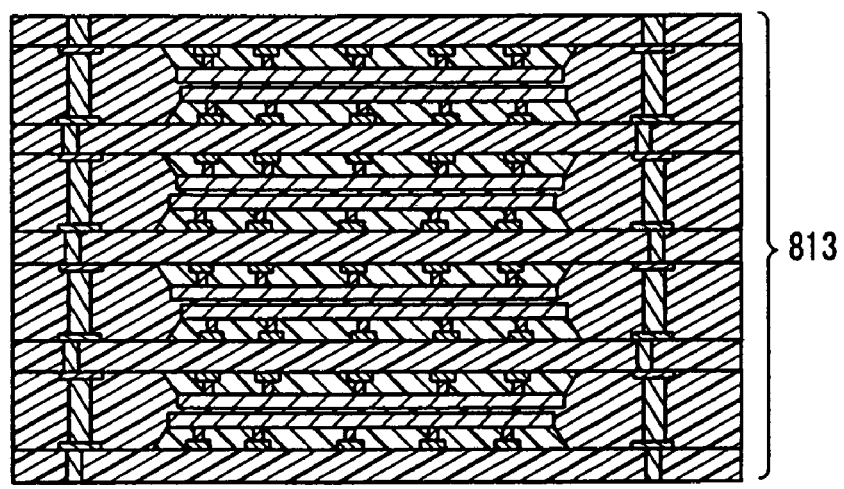

FIG. 9B illustrates a cross section of a stacked module 813 according to the present embodiment.

The stacked module 813 is configured so that circuit component built-in modules 512 according to Embodiment 2 are stacked in a state in which resin sheets 811 are interposed between adjacent circuit component built-in modules.

This configuration allows the rewiring portions of terminals of the semiconductor chips built in a circuit component built-in module to be formed in two layers arranged in the thickness direction, thereby allowing wiring patterns to cross three-dimensionally. This increases the degree of freedom in the structure designing of a circuit board. For instance, in the case of an eight-layer stacked module, it has a thickness of approximately 1 mm, which is thin, and hence it is applicable in a wider range. For instance, a stacked module having a total thickness of not more than 1.5 mm in a state of being mounted on a mother board can be obtained.

The following describes an example of a method for manufacturing a stacked module 813 according to the present embodiment, while referring to FIGS. 8A to 8D, 9A, and 9B.

First of all, a circuit component built-in module 810 is produced in the same manner as that in Embodiment 2 except that the heating temperature is set to be in a range of 100° C. to 130° C. so that a mixture of a composite sheet 801 and a conductive resin composition in through holes 804 are maintained in a semi-cured or partially cured state (B-stage state).

Figure 8A:
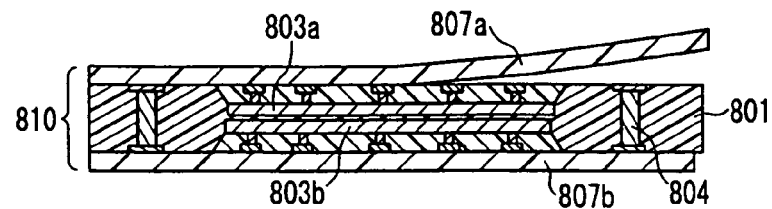
FIGS. 8A to 8D are cross-sectional views illustrating a process for manufacturing a stacked module according to Embodiment 5 of the present invention.

Next, as shown in FIG. 8A, a release carrier 807a on a surface on one side of the circuit component built-in module 810 is removed mechanically. 803a and 803b denote semiconductor chips, and 807b denotes a release carrier on the other side.

Figure 8B:
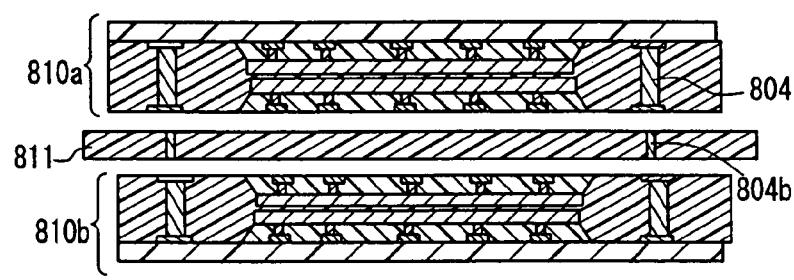

Thereafter, as shown in FIG. 8B, a resin sheet 811 (B-stage state) having inner vias 804b is interposed between circuit component built-in modules 810a and 810b, and are aligned and laminated carefully so that the release-carrier-removed adhesive surfaces of the circuit component built-in modules 810a and 810b are in contact with the resin sheet 801.

Figure 8C:
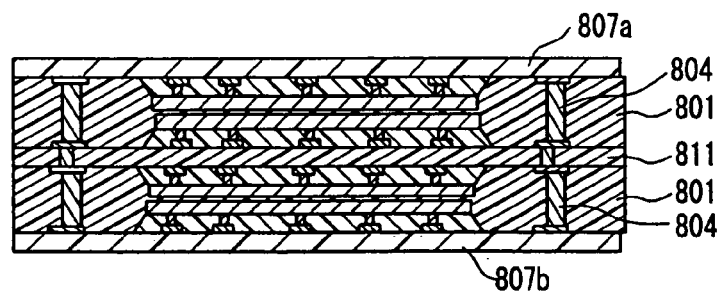

Next, a pressure is applied so as to achieve a stacked state as shown in FIG. 8C, and thereafter, it is heated at a temperature not lower than a temperature at which the composite sheet 801, the resin sheet 811, and the thermosetting resin in the through holes 804 are cured (for instance, 150° C. to 260° C.). Here, the heating temperature may be controlled to approximately 130° C. so as to maintain the B-stage state. The material of the resin sheet 811 is not limited particularly as long as it exhibits the B-stage state, but it is preferable to use a mixture having the same composition as that of the mixture used for forming the composite sheet 801, more preferably, a mixture having an inorganic filler content equal to that in the mixture used for forming the composite sheet 801.

Figure 8D:
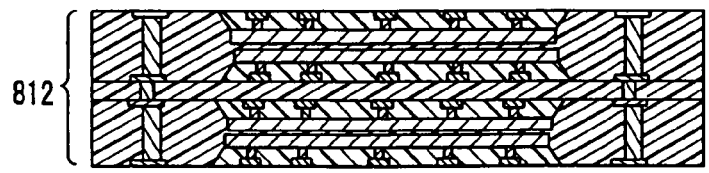

Then, as shown in FIG. 8D, the release carriers 807a and 807b are removed mechanically from the top and bottom surfaces of the stacked module 812.

Thereafter, as shown in FIG. 9A, a resin sheet 811b (B-stage state) is interposed between adjacent stacked modules 812a and 812b, and resin sheets 811a and 811c (B-stage state) are arranged on the top and bottom surfaces of the stacked product. They are aligned and laminated carefully, and are subjected to pressure application so as to be stacked. Thereafter, the stacked product is heated at a temperature not lower than the temperature at which the composite sheet 801, the resin sheets 811, and the not cured thermosetting resin in the through holes 804 is cured (for instance, 150° C. to 260° C.). Thus, an eight-layer stacked module 813 as shown in FIG. 9B is obtained.

In this manufacturing method, circuit component built-in modules are stacked while removing a releasing carrier from only one side of each circuit component built-in module. Therefore, the releasing carriers protect the wiring patterns upon the pressure application, thereby preventing oxidization of the wiring patterns by air. Furthermore, the resin sheet 811 functions as a buffer layer for avoiding contact between unit modules, thereby effectively preventing semiconductor chips from being damaged upon the application of pressure for stacking.

Furthermore, terminal electrodes are exposed on the top and bottom principal surfaces of the stacked modules by removing the release carriers. Therefore, before further stacking the stacked modules, the quality check such as the continuity test can be performed more perfectly.

EMBODIMENT 6

Figure 10A:
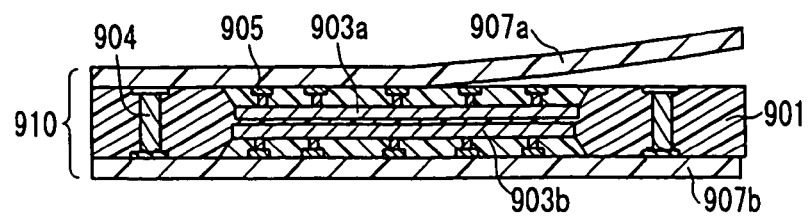
FIGS. 10A to 10D are cross-sectional views illustrating a process for manufacturing a stacked module according to Embodiment 6 of the present invention.
Figure 10B:
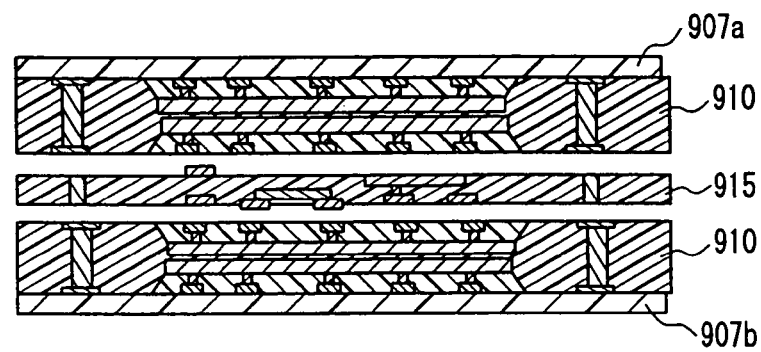
Figure 10C:
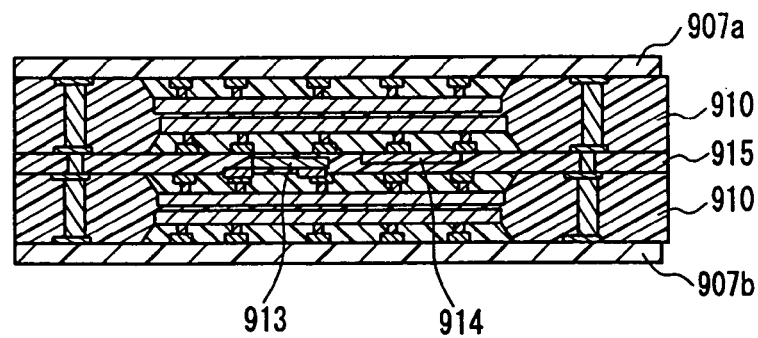
Figure 10D:
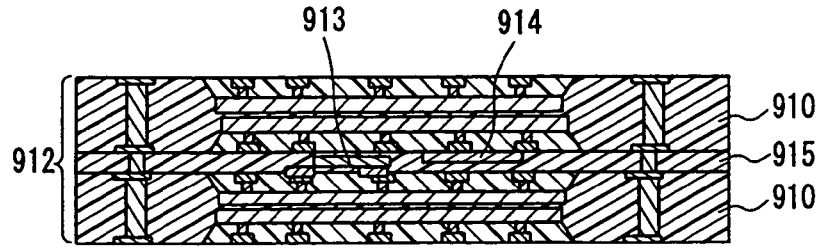

FIG. 10D illustrates a cross section of a stacked module 912 according to the present embodiment. The stacked module 912 has the same configuration as that of the stacked module 813 according to Embodiment 5 except that a connection sheet 915 including a film-form capacitor 914 and a film-form resistor 913 is provided in place of the resin sheet 811.

This configuration allows the film-form capacitor to be arranged closer to the semiconductor chip with a distance therebetween of smaller than the module thickness, thereby allowing the capacitor to function effectively as a by-pass capacitor. Furthermore, the capacitor is made to have an enormous capacitance.

The following describes an example of a method for manufacturing a circuit component built-in module according to the present embodiment, while referring to FIGS. 10A to 10D and 11A to 11C.

First of all, a circuit component built-in module 910 is produced in the same manner as that according to Embodiment 5. Then, as shown in FIG. 10A, a release carrier 907a on one side of the circuit component built-in module 910 is removed mechanically. 901 denotes a composite sheet, 903a and 903b denote semiconductor chips, 904 denotes an inner via, 905 denotes a bump, and 907b denotes a release carrier on the opposite side.

Figure 11A:
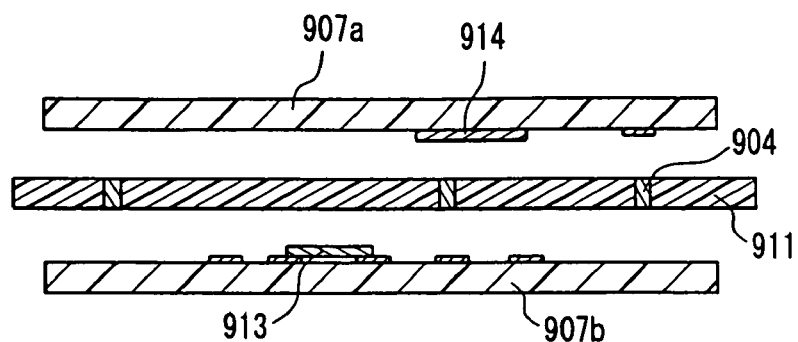
FIGS. 11A to 11C are cross-sectional views illustrating a process for manufacturing the stacked module according to Embodiment 6 of the present invention.
Figure 11B:
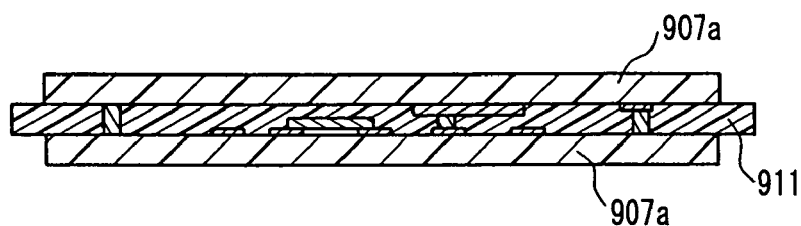
Figure 11C:
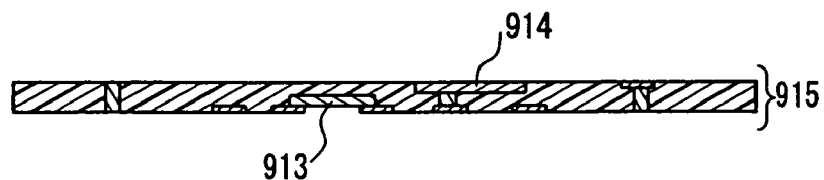
Figure 12A:
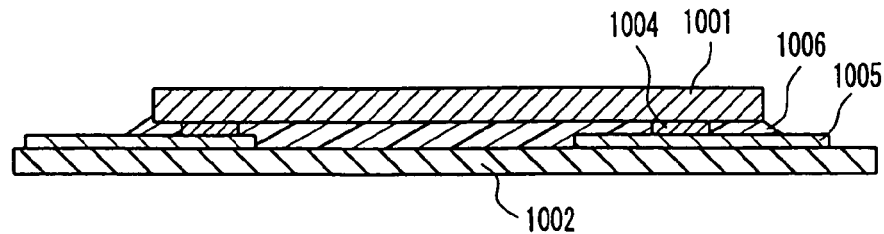
FIGS. 12A and 12B are cross-sectional views illustrating a stacked module according to the prior art.
Figure 12B:
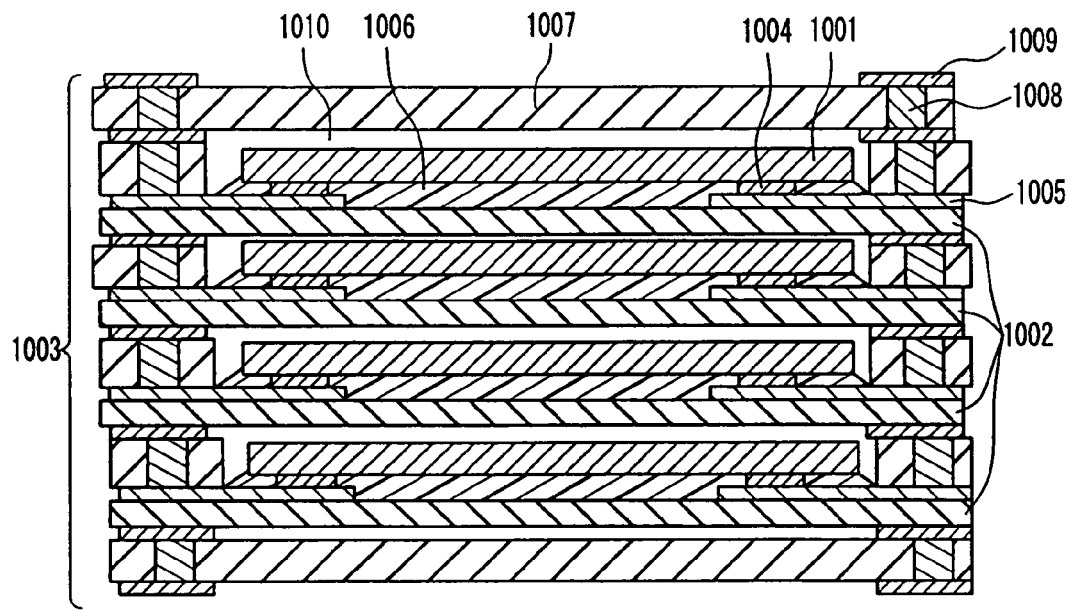
Figure 13:
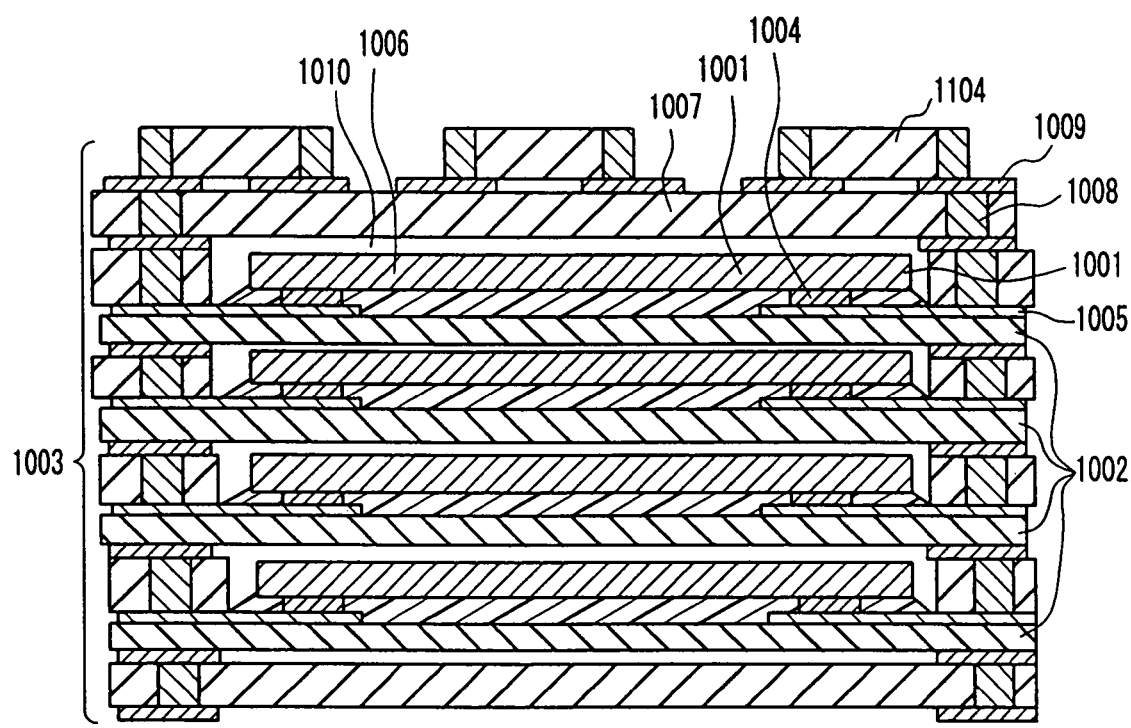
FIG. 13 is a cross-sectional view illustrating another stacked module according to the prior art.

Separately, as shown in FIGS. 11A to 11C, a connection sheet 915 is prepared. First of all, as shown in FIG. 11A, the release carrier 907a on whose surface the film-form capacitor 914 is printed, the release carrier 907b on which the film-form resistor 913 is printed, and the resin sheet 911 having the through holes 904 are aligned and laminated, so as to be in a stacked state as shown in FIG. 11B. Here, predetermined wiring patterns are formed on the release carriers 907a and 907b. Furthermore, the capacitor 914 and the resistor 913 are formed on the release carriers 907a and 907b, respectively, by a thin film forming method such as vapor deposition, sputtering, or metal-organic chemical vapor deposition (MOCVD), or alternatively, by screen printing or the like. Furthermore, the material of the resin sheet 911 is not limited particularly as long as it exhibits a B-stage state, but it is preferable to use a mixture having the same composition as that of the mixture used for forming the composite sheet 901, more preferably, a mixture having an inorganic filler content equal to that in the mixture used for forming the composite sheet 901. Then, as shown in FIG. 11C, the release carriers 907a and 907b are removed mechanically from the top and bottom surfaces of the resin sheet 911, whereby the resistor 913 and the capacitor 914 are transferred onto the resin sheet 911 and embedded therein. Thus, the connection sheet 915 is prepared.

Thereafter, as shown in FIG. 10B, in the same manner as that according to Embodiment 5, the connection sheet 915 is interposed between adjacent circuit component built-in modules 910, and they are aligned and laminated, then subjected to the pressure application, so as to be in a stacked state as shown in FIG. 10C. Then, as shown in FIG. 10D, the release carriers 907a and 907b are removed mechanically from top and bottom surfaces of a stacked module 912 thus formed.

Thus, a stacked module 912 in which semiconductor chips are stacked in four layers is obtained.

According to the present embodiment, a by-pass capacitor can be arranged very closely to bare semiconductor terminal electrodes. Therefore, the module is capable of exhibiting a high noise performance.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A circuit component built-in module manufacturing method, the circuit component-built in module including: a first electrical insulating substrate made of a mixture containing an inorganic filler and a thermosetting resin; a plurality of wiring patterns formed at least on a principal surface of the first electrical insulating substrate; a semiconductor chip incorporated in the first electrical insulating substrate and connected electrically with the wiring patterns; and inner vias formed to pass through the first electrical insulating substrate so as to electrically connect the plurality of wiring patterns with one another, the method comprising:

(a) preparing a plate-like member by forming through holes in the first electrical insulating substrate and filling the through holes with a thermosetting conductive material;

(b) mounting a semiconductor chip on wiring patterns formed on a release carrier;

(c) grinding a non-wiring surface of the semiconductor chip so as to reduce a thickness of the semiconductor chip to not less than 30 µm to not more than 100 µm;

(d) aligning and laminating the plate-like member on a surface of the release carrier where the wiring patterns are formed so that the wiring patterns fall on the through holes filled with the conductive material, and applying pressure thereto so that the semiconductor chip is embedded in the plate-like member, thereby obtaining a semiconductor-chip-embedded product;

(e) heating the semiconductor-chip-embedded product so that the mixture and the conductive material are cured simultaneously, to obtain the circuit component built-in module with a thickness of not less than 80 µm and not more than 200 µm; and (f) removing the release carrier.

2. The circuit component built-in module manufacturing method according to claim 1, wherein, in (d), two of the release carriers on each of which the wiring patterns are formed and the semiconductor chips is mounted are utilized, and the plate-like member and the two release carriers are aligned, laminated, and subjected to pressure, with the plate-like member being interposed between the release carriers, so that the two semiconductor chips are embedded in the plate-like member in a state in which the semiconductor chips are arranged in a thickness direction and upper surfaces of the semiconductor chips face each other.

3. The circuit component built-in module manufacturing method according to claim 1, wherein
- some of the wiring patterns are formed on the other principal surface of the first electrical insulating substrate,
- two of the semiconductor chips are incorporated in the first electrical insulating substrate, in a state in which the semiconductor chips are arranged in a thickness direction of the first electrical insulating substrate and upper surfaces thereof face each other, and
- one of the two semiconductor chips is connected electrically with the wiring patterns formed on one of the principal surface of the first electrical insulating substrate, and the other semiconductor chip is connected electrically with the wiring patterns formed on the other surface of the first electrical insulating substrate.

4. The circuit component built-in module manufacturing method according to claim 1, wherein the wiring patterns formed at least on the principal surface of the first electrical insulating substrate constitute a part of wiring patterns on a top layer of a multilayer wiring substrate laminated on the first electrical insulating substrate.

5. The circuit component built-in modulate manufacturing method according to claim 1, wherein the electrical insulating substrate further incorporates a passive component, and the passive component is connected electrically with any one of the plurality of wiring patterns.

6. The circuit component built-in module manufacturing method according to claim 5, wherein the passive component is at least one selected from an inductor, a capacitor, and a resistor.

7. The circuit component built-in module manufacturing method according to claim 1, wherein connected portions where the semiconductor chip and the wiring pattern are connected are reinforced by an underfill resin, a non-conductive film, or an anisotropic conductive film containing conductive particles.

8. The circuit component built-in modules manufacturing method according to claim 1, further comprising (g) stacking four to eight of the circuit component built-in modules obtained through (a) to (f) so as to be in a multilayer module form, wherein adjacent ones of the circuit component built-in modules are connected electrically with each other through the inner vias.

9. The circuit component built-in module manufacturing method according to claim 8, further comprising (h) arranging second electrical insulating substrates between adjacent ones of the circuit component built-in modules, the second electrical insulating substrates being made of the same composition as that of the first electrical insulating substrate.

10. The circuit component built-in module manufacturing method according to claim 1, further comprising (i) stacking four to eight of the circuit component built-in modules obtained through (a) to (f) so as to be in a multilayer module form, wherein the stacking (i) includes:
- arranging second electrical insulating substrates between adjacent ones of the circuit component built-in modules; and
- arranging film-form passive elements on the second electrical insulating substrates.

11. The circuit component built-in module manufacturing method according to claim 1, wherein the circuit component built-in module has a thickness of 100 μm to 150 μm.

12. The circuit component built-in module manufacturing method according to claim 11, wherein the release carrier is a metal sheet or a resin sheet.

13. The circuit component built-in module manufacturing method according to claim 12, wherein the resin sheet is a resin film made of at least one selected from polyimide, polyethylene terephthalate, polyethylene naphthalate, polyphenylene sulfite, polyethylene, polypropylene, and fluorine resins.

14. The circuit component built-in module manufacturing method according to claim 12, wherein the metal sheet is a copper foil.

15. The circuit component built-in module manufacturing method according to claim 1, wherein
- the release carrier is made of a copper foil,
- the wiring patterns are made of copper foils, and
- a detachment layer provided between the release carrier and the wiring patterns is made of a chrome-plated layer.

* * * * *